United States Patent [19]
Sezi

[11] Patent Number: 5,412,386
[45] Date of Patent: May 2, 1995

[54] ARRANGEMENT FOR CONVERTING A PLURALITY OF ELECTRICAL ANALOG MEASUREMENT SIGNALS THAT ARE APPLIED SIMULTANEOUSLY TO ITS INPUT TERMINALS INTO A CORRESPONDING PLURALITY OF DIGITAL SIGNALS, USING AN ANTIALIASING FILTER ON THE INPUTS

[75] Inventor: Tevfik Sezi, Berlin, Germany
[73] Assignee: Siemens Aktiengesellschaft, Germany
[21] Appl. No.: 140,109
[22] PCT Filed: Apr. 3, 1992
[86] PCT No.: PCT/DE92/00279
§ 371 Date: Jan. 3, 1994
§ 102(e) Date: Jan. 3, 1994
[87] PCT Pub. No.: WO92/20025
PCT Pub. Date: Nov. 12, 1992
[30] Foreign Application Priority Data
May 3, 1991 [DE] Germany .................. 41 14 971.8
[51] Int. Cl.$^6$ ............................................. H03M 1/00
[52] U.S. Cl. ....................................... 341/141; 341/155
[58] Field of Search .................... 341/141, 155, 156
[56] References Cited

U.S. PATENT DOCUMENTS

| | | | |
|---|---|---|---|
| 4,677,422 | 6/1987 | Naito | 341/122 |
| 4,973,976 | 11/1990 | Lee et al. | 341/141 |
| 4,982,193 | 1/1991 | Saul | 341/159 |
| 5,075,678 | 12/1991 | Ohlsson et al. | 341/131 |
| 5,202,686 | 4/1993 | Rapp et al. | 341/139 |
| 5,210,707 | 5/1993 | Hamamatsu | 364/602 |

FOREIGN PATENT DOCUMENTS

| | | |
|---|---|---|
| 0351788 | 1/1990 | European Pat. Off. . |
| 0372526 | 6/1990 | European Pat. Off. . |
| 31 26 485 | 1/1983 | Germany . |
| 34 27 620 | 2/1985 | Germany . |
| 37 38 815 | 4/1989 | Germany . |

OTHER PUBLICATIONS

Kress, D. and Irmer, R., Angewandte Systemtheorie, Oldenbourg-Verlag, München Wien 1990, ISBN 3-48-6-21300-8, S. 171,172.

IBM Technical Disclosure Bulletin, vol. 23, No. 9, Feb. 1981, New York, US, pp. 4210-4213; Zumbado: *Data Acquisition System Architecture With Dedicated Sample Holds*.

*Primary Examiner*—Marc S. Hoff
*Attorney, Agent, or Firm*—Kenyon & Kenyon

[57] ABSTRACT

The present invention relates to a circuit for converting a plurality of analog electrical measurement signals into corresponding digital signals. To realize such a circuit with relatively few circuit elements, input-side antialiasing filters are linked on the output side to at least two multiplexers, which have at least two downstream sample-and-hold circuits connected to them. At least two analog-digital converters are linked on the input side to the output of a sample-and-hold circuit. An evaluation device is arranged downstream from the at least two analog-digital converters and acquires in one evaluation interval (0 through T1) digital values corresponding to several sampling values of an electrical signal, and produces the corresponding digital signal through mean value generation. A control device is connected to the at least two multiplexers and controls these multiplexers so as to allow the outputs of the antialiasing filters to be connected via the one multiplexer, consecutively in one sequence and, at the same time, via the second multiplexer, consecutively and in reversed sequence, to the sample-and-hold circuits.

11 Claims, 2 Drawing Sheets

ARRANGEMENT FOR CONVERTING A PLURALITY OF ELECTRICAL ANALOG MEASUREMENT SIGNALS THAT ARE APPLIED SIMULTANEOUSLY TO ITS INPUT TERMINALS INTO A CORRESPONDING PLURALITY OF DIGITAL SIGNALS, USING AN ANTIALIASING FILTER ON THE INPUTS

BACKGROUND OF THE INVENTION

The present invention relates generally to analog-digital converters, and more particularly to an analog-digital converter for converting analog measurement signals into corresponding digital signals.

A circuit for converting a plurality of analog electrical measurement signals applied to input terminals into corresponding digital signals has become known, within the scope of the Siemens high-voltage protection unit 7 SA 502. In this unit, several analog electrical measurement signals are acquired by the circuit and, after being converted into digital signals, are compared to one another to determine faulty system conditions.

For this purpose, the circuit includes an antialiasing filter 1 (shown in FIG. 1) on the input side for each electrical measurement signal to be convened. It is linked by its input to an input terminal E1 to an analog electrical measurement signal M1. Altogether, twelve analog electrical measurement signals M1 through M12, which are each applied to input terminals E1 through E12, are acquired by the circuit. Since the input sections of the unit arranged downstream from the input terminals have the same design, only the input section for the analog electrical measuring signal M1 will be described in the following. An amplifier 2 having a gain of V=1 is arranged downstream from the antialiasing filter 1 just mentioned above. Linked to this amplifier 2 is a sample-and-hold circuit 3, which with one input 4 is arranged downstream from a multiplexer 5. An analog-digital converter 6 having a downstream evaluation unit (not shown in FIG. 1) connected to it, is linked to the multiplexer 5 on the output side.

Also depicted in FIG. 1 is another amplifier 7 having a gain of V=16, which is arranged downstream from the antialiasing filter 1. An additional multiplexer 9 having a further downstream analog-digital converter 10 connected to it on the output side is linked via an additional sample-and-hold circuit 8 to the other amplifier 7. This analog-digital converter 10 is likewise connected on the output side to the evaluation unit that is not shown. Provision is made to utilize the evaluation path comprising the amplifier 2, so that one will still be able to work with adequate precision, even given saturation of the amplifier 7.

In the same way as they are connected to the input terminal E1, the multiplexers 5 and 9 are connected via additional sample-and-hold circuits (not shown) corresponding to the circuits 3 and 8 as well as via amplifiers (likewise not shown) corresponding to the amplifiers 2 and 7, as well as in each case via an antialiasing filter corresponding to the filter 1 to the other input terminals for the measurable quantities M2 through M12.

The application of the sample-and-hold circuits 3 and 8 for the various analog electrical measuring signals M1 through M12 ensures that the various analog electrical measuring signals are each acquired at the same instant. After the query has been made by the multiplexers 5 and 9 and conversion into digital signals is complete, the state of the power system to be monitored can then be inferred in the evaluation device (not shown) from a comparison of the digital signals corresponding to the analog electrical measuring signals.

A circuit similar to the one shown in FIG. 1 is described in the "IBM Technical Disclosure Bulletin", vol. 33, no. 9, February 1981, pp. 4210–4213. Moreover, this literature reference discloses a circuit for converting a plurality of analog measuring signals being applied to input terminals into corresponding digital signals, in the case of which several measurable quantities are supplied to each of several multiplexers via input filters. On the output side, a series circuit comprising a sample-and-hold circuit having a downstream analog-digital converter is linked to each multiplexer.

Furthermore, EP 0 372 526 A2 discloses a microcomputer, which renders possible a rapid analog-digital conversion. In the case of this known arrangement, several sample-and-hold circuits are either linked to a single measurable quantity or to several measurable quantities via transfer gate circuits, which function as multiplexers due to their drive circuit. The sampled values are supplied one after another to a device for analog-digital conversion.

The present invention is directed to the problem of developing a circuit for converting a plurality of analog electrical measurement signals applied to input terminals into corresponding digital signals, which, while enhancing the effect of the antialiasing filter, can be realized with a relatively small number of circuit elements.

SUMMARY OF THE INVENTION

The present invention solves this problem by providing a circuit including: (1) several antialiasing filters, which are coupled to an input terminal; (2) at least two multiplexers, which are coupled to the antialiasing filters; (3) at least two sample-and-hold circuits, each of which are coupled to one of the multiplexers' output; (4) at-least two analog-digital converters, each of which are coupled to the outputs of one of the sample-and-hold circuits; (5) an evaluation device, which is arranged downstream from the two analog-digital converters and which, in one evaluation interval determines digital values corresponding to several sampling values of an analog electrical signal, and which produces the corresponding digital signal through mean value generation; and (6) a control device, which is connected to the two multiplexers and which controls the multiplexers so as to allow the outputs of the antialiasing filters to be connected via the one multiplexer, consecutively and in sequence and, at the same time, the outputs of the antialiasing filter to be connected via the second multiplexer, consecutively and in reversed sequence, to the sample-and-hold circuits.

In accordance with the present invention, the antialiasing filters are each linked by their input to an input terminal and by their output to an input of at least two multiplexers. The circuit of the present invention is provided with at least two sample-and-hold circuits, which are each linked by their input to an output of a multiplexer, and with at least two analog-digital converters, which are each linked by their input to the output of a sample-and-hold circuit. The circuit of the present invention is also provided with an evaluation device, which is arranged downstream from the at least two analog-digital converters and which, in one evaluation interval, determines digital values corresponding to several sampling values of an analog electrical signal, and produces the corresponding digital signal through mean value generation. The circuit is also provided with a control device, which is connected to the at least two multiplexers and controls the multiplexers so as to allow the outputs of the antialiasing filter to be connected via the one multiplexer, consecutively and in sequence and, at the same time, the outputs of the antialiasing filter to be connected via the second multiplexer, consecutively and in reversed sequence, to the sample-and-hold circuits.

Compared to the known device for converting a relatively large number of analog electrical measuring signals into digital signals, the important advantage of the circuit according to the present invention is that it operates with only two multiplexers and only two sample-and-hold circuits, in its basic structure, and only one evaluation path is provided for each analog electrical measuring signal. If—as in the case of the unit discussed above—two evaluation paths are provided via two amplifiers having different gains, then altogether four multiplexers and four sample-and-hold circuits having downstream analog-digital converters are required to convert all analog electrical measuring signals. This results in a considerable cost reduction, because to convert all analog electrical measuring signals in the case of the circuit according to the present invention, only half as many hold circuits are required as in the case of the known circuit arrangement for converting one single electrical measuring signal. It may be that twice as many multiplexers are used for this purpose, but this additional expenditure is not particularly high.

Another advantage of the circuit arrangement according to the present invention is that antialiasing filters having a relatively simple design (without amplifiers) can be used, because the mean value generation has the effect of an additional damping. The simply constructed antialiasing filters reduce offset problems and render possible a simple compensation of the circuit.

The structure of the circuit according to the present invention is based on the realization that a sampling scheme that is symmetrical at a middle instant can be achieved by controlling the multiplexers as indicated above; by performing a mean value generation on the basis of the digital values allocated in each case to a measuring signal and by making an acquisition at this middle instant, digital signals corresponding to the analog electrical measuring signals are able to be acquired, so that by comparing these digital signals, it is possible for the analog electrical measuring signals to be compared in relation to one and the same measuring instant, without the occurrence of corrupting phase shifts.

In one advantageous specific embodiment of the circuit according to the present invention, the evaluation device is conceived to acquire digital values corresponding in each case to two sampling values of an analog electrical signal within the appropriately timed evaluation interval and to generate the corresponding digital signal through mean value generation.

The advantages indicated above of the circuit arrangement according to the present invention become especially clear when its evaluation device is conceived to acquire digital values corresponding in each case to four sampling values of an analog electrical signal within an appropriately timed evaluation interval and to generate the corresponding digital signal through mean value generation. In this case, antialiasing filters designed as RC-elements can be used while excellent damping is attained.

Within the scope of the present invention, it is considered to be advantageous when the circuit according to the invention is provided with four multiplexers, two of which are linked via an amplifier having a gain of 1 and two further multiplexers via an amplifier having an increased gain to the antialiasing filter, and with four sample-and-hold circuits arranged downstream from the multiplexers, and with four analog-digital converters, which are arranged downstream from the sample-and-hold circuits and are linked by their outputs to the evaluation device. Thus, as in the case of the circuit discussed in the Background section above, the accuracy is also able to be maintained when the amplifier having an increased gain becomes saturated during the measuring operation.

In the case of the circuit according to the present invention, a signal processor is advantageously employed as an evaluation device.

DETAILED DESCRIPTION

Figure 1:
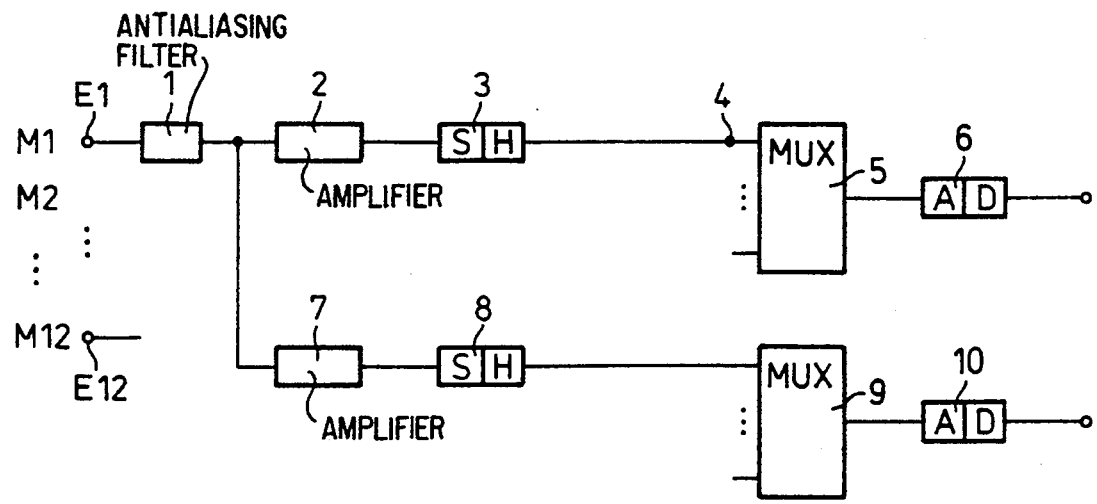
FIG. 1 depicts a circuit according to the prior art.
Figure 2:
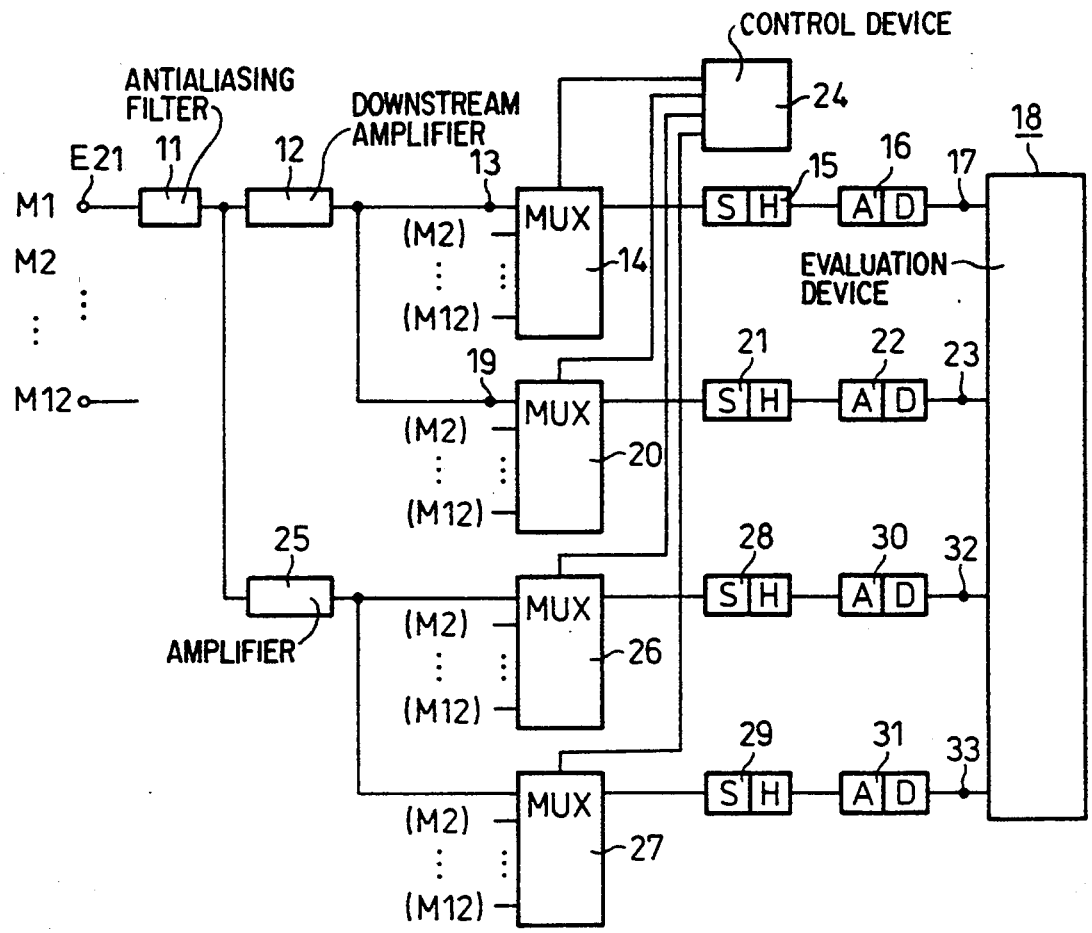
FIG. 2 depicts an exemplified embodiment of the circuit according to the present invention.

In accordance with FIG. 2, an antialiasing filter 11 is shown, which antialiasing filter 11 has a downstream amplifier 12 with unity gain ($V=1$) connected to it in an evaluation path. The input of the antialiasing filter 11 is linked to an input terminal E21. A multiplexer 14, which has a downstream sample-and-hold circuit 15 connected to it on the output side, is linked by its input 13 to the output of this amplifier 12. An analog-digital converter 16, which is connected on the output side to an input 17 of an evaluation device 18, is linked on the output side to the sample-and-hold circuit 15.

An additional multiplexer 20, which has another downstream sample-and-hold circuit 21 connected to it, is linked by an input 19 to the output of the amplifier 12. This sample-and-hold circuit 21 is connected on the output side to an analog-digital converter 22, which is connected on the output side to another input 23 of the evaluation device 18.

Similarly, additional measurable quantities M2 through M12 are connected in each case via an antialiasing filter corresponding to antialiasing filter 11 having an amplifier corresponding to the amplifier 12 to further inputs of the multiplexers 14 and 20. These multiplexers 14 and 20 are controlled by means of a control device 24 so as to allow segments from the sampling signals corresponding to the analog electrical measurable quantities M1 through M12 to be switched through in accordance with line 3 of FIG. 3 in a sequence and consecutively to the downstream sample-and-hold circuits 15 or 21, as is apparent from the two top lines of FIG. 3. Due to space limitations, the various measuring signals are only represented in this FIG. by their characteristic numerals.

Figure 3:
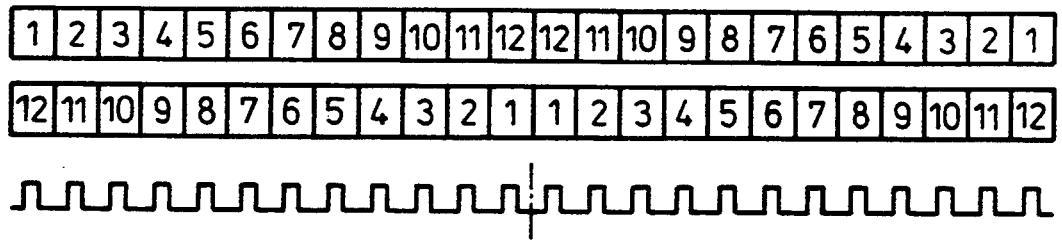
FIG. 3 depicts a sampling scheme for the individual electrical measuring signals.

In detail, FIG. 3 illustrates that in accordance with the third line in FIG. 3, the measurable quantity M1 is transferred by the multiplexer 14, initially for the duration of the first sampling signal, to the sample-and-hold circuit 15 (compare line 1 of FIG. 3). At the same time, the measurable quantity M12 is switched through to the sample-and-hold circuit 21 by the multiplexer 20. After a subsequent sampling pulse, the measurable quantity M2 is switched through to the sample-and-hold circuit 15 by the multiplexer 14, while the multiplexer 20 switches through the measurable quantity M11 to the sample-and-hold circuit 21. Thus, with each sampling pulse, both multiplexers 14 or 20 switch through the analog electrical measuring signals M1 through M12 in a reversed sequence, as is quite apparent from the top lines of FIG. 3.

Figure 4:
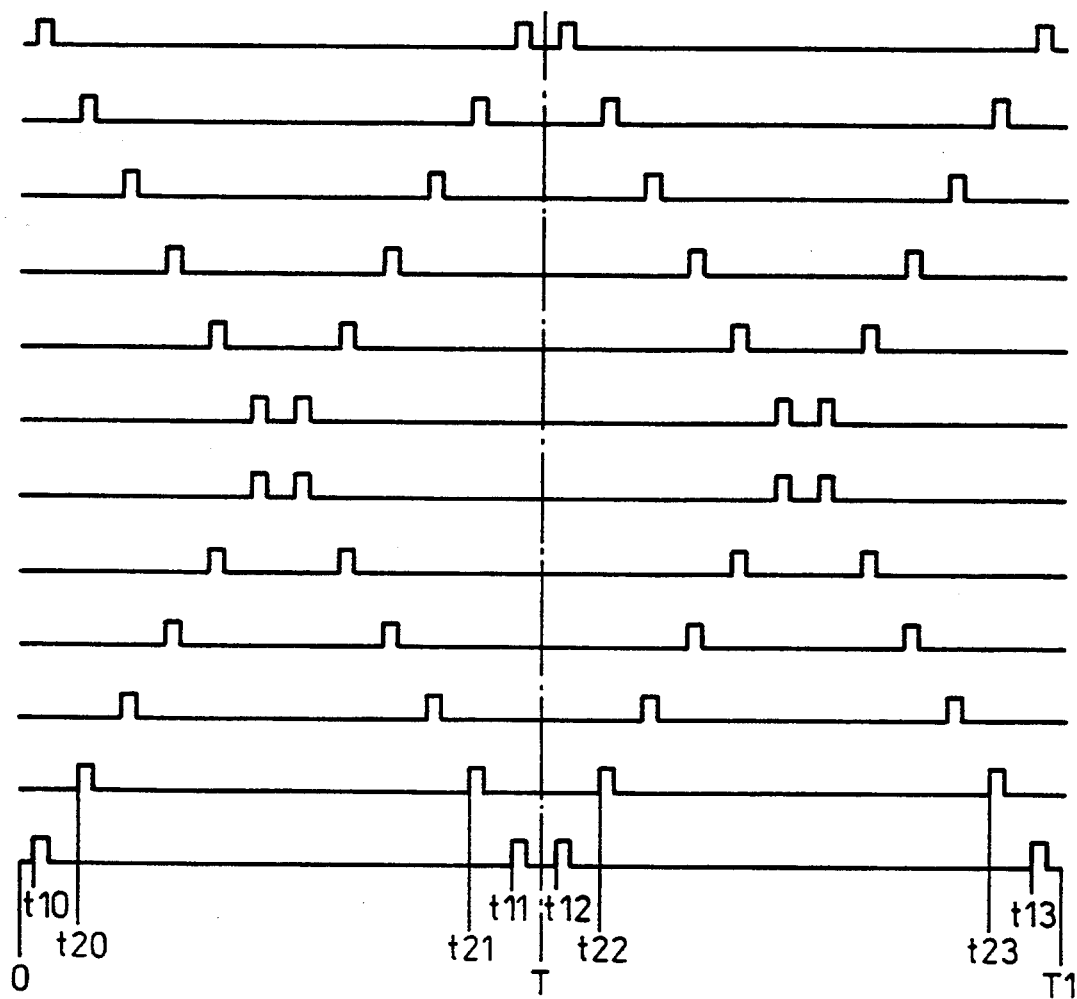
FIG. 4 depicts a sampling pattern for the individual electrical measuring signals.

This leads, as FIG. 4 shows, to the measurable quantity M1 being acquired at the instant t10, as well as at the instants t11, t12 and t13. In connection with FIG. 3, the result is that the measurable quantity M2 is sampled at the instants t20, t21, t22 and t23. This applies correspondingly for the remaining measurable quantities M3 through M12, so that a sampling pattern results, as shown in FIG. 4. This pattern is symmetrical in relation to the instant T. If, at this point, one calculates the mean value for the evaluation interval 0 through T1 using the evaluation device 18, which is preferably designed as a signal processor, then on the basis of the sampling pattern at the instant T1 (end of the evaluation interval), mean values result for each sampled measurable quantity, which correspond to the analog electrical measuring signals. Thus, in spite of the sequential sampling of the analog electrical measuring signals, a matching temporal reference point is obtained, and system disturbances can be inferred from a comparison of the digital signals.

It is also possible to place the evaluation interval in the range of 0 through T. Then, only two digital values acquired from each analog measuring signal are retrieved in each case for purposes of mean value generation.

In the exemplified embodiment of FIG. 2, another amplifier 25 having a gain of V=16 is linked to the output of the antialiasing filter 11. Additional downstream multiplexers 26 and 27, which have sample-and-hold circuits 28 and 29 linked to their outputs, are connected to this amplifier 25. Arranged downstream from these sample-and-hold circuits, in turn, is an additional analog-digital converter 30 and 31, which is connected on the output side to inputs 32 and 33 of the evaluation device 18. The circuit section arranged downstream from the amplifier 25 works with the multiplexers 14 and 20 in the exact same way as the circuit section dealt with in detail above. Therefore, to avoid being repetitive, it is not necessary to describe the mode of functioning in greater detail here. The two circuit sections are effective given measuring signals M1 through M12 of varying levels.

I claim:

1. A method for converting a plurality of analog signals into a plurality of corresponding digital signals, comprising the steps of:
   a) multiplexing the plurality of analog signals into a first sequence of analog signals, wherein said first sequence of analog signals corresponds to a the plurality of analog signals in consecutive order;
   b) multiplexing the plurality of analog signals into a second sequence of analog signals, wherein said second sequence of analog signals corresponds to a the plurality of analog signals in reverse order from the first sequence;
   c) converting the first sequence of analog signals into a first digital sequence of digital values;
   d) converting the second sequence of analog signals into a second digital sequence of digital values;
   e) obtaining at least two digital values for each of the plurality of analog signals during a first time interval;
   f) determining a mean value of the at least two digital values for each of the plurality of analog signals; and
   g) providing the mean value as the corresponding digital signal for each of the plurality of analog signals.

2. The method according to claim 1, further comprising the steps of:
   h) multiplexing the plurality of analog signals into a third sequence of analog signals, wherein said third sequence of analog signals corresponds to a the plurality of analog signals in consecutive order;
   i) multiplexing the plurality of analog signals into a fourth sequence of analog signals, wherein said fourth sequence of analog signals corresponds to a the plurality of analog signals in reverse order from the third sequence;
   j) converting the third sequence of analog signals into a third digital sequence of digital values;
   k) converting the fourth sequence of analog signals into a fourth digital sequence of digital values;
   l) obtaining at least four digital values for each of the plurality of analog signals during said first time interval; and
   m) determining a mean value of at least four digital values for each of the plurality of analog signals.

3. The method according to claim 2, further comprising the steps of:
   n) amplifying each of the plurality of analog signals with a first amplifier having a gain of one before the steps a) and b) of multiplexing; and
   o) amplifying each of the plurality of analog signals with a second amplifier having a gain larger than one before the steps h) and i) of multiplexing.

4. The method according to claim 1, further comprising the steps of:
   h) obtaining at least two additional digital values for each of the plurality of analog signals during a second time interval, which immediately follows the first time interval; and
   i) determining the mean value of the least two digital values and the at least two additional digital values for each of the plurality of analog signals.

5. The method according to claim 1, further comprising the step of filtering each of the plurality of analog signals with an antialiasing filter before multiplexing them.

6. An apparatus for converting a plurality of analog signals into a plurality of corresponding digital signals, comprising:
   a) a plurality of antialiasing filters, each having an input receiving one of the plurality of analog signals and each having a filtered analog signal as an output;
   b) a first multiplexer having a plurality of inputs receiving the filtered analog signals from the plurality of antialiasing filters, and outputting a first sequence of the filtered analog signals in consecutive order;
   c) a second multiplexer having a plurality of inputs receiving the filtered analog signals from the plurality of antialiasing filters, and outputting a second sequence of the filtered analog signals in reverse order from the first sequence of filtered analog signals;

d) a first digitizer receiving the first sequence from the first multiplexer, and outputting a first sequence of digital values corresponding to the first sequence of the filtered analog signals;

e) a second digitizer receiving the second sequence from the second multiplexer, and outputting a second sequence of digital values corresponding to the second sequence of the filtered analog signals;

f) an evaluation device having a first input receiving the first sequence of digital values, having a second input receiving the second sequence of digital values, wherein, during a first evaluation interval, said evaluation device receives at least two digital values for each of the plurality of analog signals, calculates a mean value from said at least two digital values for each of the plurality of analog signals, and outputs these mean values as the plurality of corresponding digital signals; and g) a control device having a first control output coupled to the first multiplexer, and having a second control output coupled to the second multiplexer, wherein said control device controls the first and second multiplexers to create the first and second sequences.

7. The apparatus according to claim 6, wherein said first digitizer further comprises:
   (i) a first sample-and-hold circuit being coupled to the first multiplexer, and outputting a first sequence of sampled values corresponding to said first sequence of filtered analog signals; and
   (ii) a first analog-to-digital converter being coupled the first sample-and-hold circuit and outputting the first sequence of digital values, which correspond to the first sequence of sampled values; and
   wherein said second digitizer further comprises:
   (i) a second sample-and-hold circuit being coupled to the second multiplexer, and outputting a second sequence of sampled values corresponding to said second sequence of filtered analog signals; and
   (ii) a second analog-to-digital converter being coupled the second sample-and-hold circuit and outputting the second sequence of digital values corresponding to the first sequence of sampled values.

8. The apparatus according to claim 6, wherein said evaluation device acquires four digital values corresponding to four samples of each of the plurality of analog signals within the first evaluation interval, and calculates the mean value from the four digital values for each of the plurality of analog signals.

9. The apparatus according to claim 6, further comprising:
   h) a first plurality of amplifiers, each having a gain of one, each being coupled to the output of one of the plurality of antialiasing filters, and said first plurality of amplifiers outputting a first plurality of filtered amplified analog signals corresponding to the plurality of analog signals, wherein said first and second multiplexers are coupled to the first plurality of amplifiers, said first and second multiplexers receive as their inputs the first plurality of filtered amplified analog signals, said first multiplexer outputs a first sequence of the filtered amplified analog signals in consecutive order, and said second multiplexer outputs a second sequence of the filtered amplified analog signals in reverse order from the first sequence of filtered amplified analog signals;

i) a second plurality of amplifiers, each having a gain larger than one, each being coupled to the output of one of the plurality of antialiasing filters, and said second plurality of amplifiers outputting a second plurality of filtered amplified analog signals corresponding to the plurality of analog signals;

j) a third multiplexer being coupled to the second plurality of amplifiers, receiving as its inputs the second plurality of filtered amplified analog signals, and outputting a third sequence of the filtered amplified analog signals in consecutive order;

k) a fourth multiplexer being coupled to the second plurality of amplifiers, receiving as its inputs the second plurality of filtered amplified analog signals, and outputting a fourth sequence of the filtered amplified analog signals in reverse order from the third sequence of the filtered amplified analog signals;

l) a third digitizer being coupled to the third multiplexer, receiving the third sequence of the filtered amplified analog signals as its input, and outputting a third sequence of digital values corresponding to the third sequence of filtered amplified analog signals; and m) a fourth digitizer being coupled to the fourth multiplexer, receiving the fourth sequence of the filtered amplified analog signals as its input, and outputting a fourth sequence of digital values corresponding to the fourth sequence of filtered amplified analog signals, wherein said first digitizer outputs the first sequence of digital values which corresponds to the first sequence of the filtered amplified analog signals, and said second digitizer outputs the second sequence of digital values which corresponds to the second sequence of the filtered amplified analog signals.

10. The apparatus according to claim 9, wherein said first digitizer further comprises:
   (i) a first sample-and-hold circuit being coupled to the first multiplexer, and outputting a first sequence of sampled values corresponding to said first sequence of filtered analog signals; and
   (ii) a first analog-to-digital converter being coupled the first sample-and-hold circuit and outputting the first sequence of digital values, which correspond to the first sequence of sampled values; said second digitizer further comprises:
   (i) a second sample-and-hold circuit: being coupled to the second multiplexer, and outputting a second sequence of sampled values corresponding to said second sequence of filtered analog signals; and
   (ii) a second analog-to-digital converter being coupled the second sample-and-hold circuit and outputting the second sequence of digital values corresponding to the first sequence of sampled values, said third digitizer further comprises:
   (i) a third sample-and-hold circuit being coupled to the third multiplexer, and outputting a third sequence of sampled values corresponding to said third sequence of filtered amplified analog signals; and
   (ii) a third analog-to-digital converter being coupled the third sample-and-hold circuit and outputting the third sequence of digital values, which correspond to the third sequence of sampled values; and said fourth digitizer further comprises:
   (i) a fourth sample-and-hold circuit being coupled to the fourth multiplexer, and outputting a fourth sequence of sampled values corresponding to said fourth sequence of filtered amplified analog signals; and (ii) a fourth analog-to-digital converter being coupled the fourth sample-and-hold circuit and outputting the fourth sequence of digital values corresponding to the fourth sequence of sampled values.

11. The apparatus according to claim 6, wherein said evaluator comprises a signal processor.

* * * * *